(12) United States Patent
Hara

(10) Patent No.: US 7,541,258 B2
(45) Date of Patent: Jun. 2, 2009

(54) METHOD OF MANUFACTURING SEMICONDUCTOR SUBSTRATE AND METHOD OF MANUFACTURING SEMICONDUCTOR DEVICE

(75) Inventor: Toshiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 576 days.

(21) Appl. No.: 11/271,856

(22) Filed: Nov. 14, 2005

(65) Prior Publication Data

US 2006/0115935 A1 Jun. 1, 2006

(30) Foreign Application Priority Data

Dec. 1, 2004 (JP) ............... 2004-348236

(51) Int. Cl.
*H01L 21/76* (2006.01)
(52) U.S. Cl. ................. 438/424; 438/426
(58) Field of Classification Search ......... 438/149, 438/150, 151, 163, 225, 231
See application file for complete search history.

(56) References Cited

U.S. PATENT DOCUMENTS

| 4,925,805 | A | * | 5/1990 | van Ommen et al. | 438/407 |
| 5,436,173 | A | * | 7/1995 | Houston | 438/155 |
| 6,962,838 | B2 | * | 11/2005 | Anderson et al. | 438/149 |
| 2004/0251500 | A1 | * | 12/2004 | Holzl et al. | 257/347 |
| 2006/0046409 | A1 | * | 3/2006 | Fujimaki | 438/309 |

FOREIGN PATENT DOCUMENTS

| FR | 2 799 307 A1 | 4/2001 |
| JP | 52-115667 | 9/1977 |
| JP | 05-021465 | 1/1993 |
| JP | 09-162088 A | 6/1997 |
| JP | 11-220138 | 8/1999 |
| JP | A 2000-124092 | 4/2000 |
| JP | A 2002-299591 | 10/2002 |
| JP | 2003-324200 | 11/2003 |
| WO | WO 01/26160 A1 | 4/2001 |

OTHER PUBLICATIONS

Tan, Liwen et al, Fabrication of novel double-hetero-epitaxial SOI sturcture, Jan. 2003, Journal of Crystal Growth, vol. 247 Issues 3-4, pp. 255-260.*
Sakai et al., "Separation by Bonding Si Islands (SBSI) for LSI Applications," Second International SiGE Technology and Device Meeting, Meeting Abstract, pp. 230-231, May 2004.

* cited by examiner

*Primary Examiner*—Ha Tran T Nguyen
*Assistant Examiner*—Valerie Brown
(74) *Attorney, Agent, or Firm*—Oliff & Berridge, PLC

(57) ABSTRACT

A semiconductor is manufactured by forming a γ-aluminum oxide layer on a semiconductor substrate, forming a semiconductor layer on the γ-aluminum oxide layer, forming an exposed portion for exposing a part of the γ-aluminum oxide layer through the semiconductor layer, forming a support which is formed of a material having an etching rate smaller than that of the γ-aluminum oxide layer and which supports the semiconductor layer on the semiconductor substrate, forming a cavity between the semiconductor substrate and the semiconductor layer, forming a buried insulating layer in the cavity, forming a gate electrode on the semiconductor layer with a gate insulating layer therebetween and forming source/drain layers, which are disposed on both sides of the gate electrode, in the semiconductor layer.

6 Claims, 8 Drawing Sheets

METHOD OF MANUFACTURING SEMICONDUCTOR SUBSTRATE AND METHOD OF MANUFACTURING SEMICONDUCTOR DEVICE

BACKGROUND

1. Technical Field

The present invention relates to a method of manufacturing a semiconductor substrate and a method of manufacturing a semiconductor device and more particularly to a method of manufacturing a semiconductor device, which can be suitably used for a field effect transistor formed on an SOI (Silicon On Insulator) substrate.

2. Related Art

The usefulness of field effect transistors formed on an SOI (Silicon On Insulator) substrate has attracted much attention, in that isolation of semiconductor devices is easy, latch-up does not occur, and source-drain junction capacitance is small. Particularly, since full depletion-mode SOI transistors have low power consumption, can operate at a high speed, and can be easily driven with low voltage, studies for allowing the SOI transistors to operate in the complete depletion mode have vigorously advanced. Here, for example, as disclosed in Japanese Unexamined Patent Application Publication Nos. 2002-299591 and 2000-124092 which are examples of the related art, SIMOX (Separation by Implanted Oxygen) substrates or bonded substrates are used as the SOI substrates.

A method of forming SOI transistors at low cost by forming an SOI layer on a bulk substrate is disclosed in T. Sakai et al.'s paper, Second International SiGe Technology and Device Meeting, Meeting Abstract, pp. 230-231, May (2004). In the method disclosed in T. Sakai et al.'s paper, by forming Si and SiGe layers on a Si substrate and selectively removing the SiGe layer, cavities are formed between the Si substrate and the Si layer. Then, by thermally oxidizing Si exposed to the inside of the cavity, an $SiO_2$ layer is filled between the Si substrate and the Si layer and a BOX layer is formed between the Si substrate and the Si layer.

However, in order to manufacture the SIMOX substrate, it is necessary to ion-implant oxygen with a high concentration into a silicon wafer. In addition, in order to manufacture the bonded substrate, it is necessary to bond two silicon wafers to each other and then to polish the surface of the combined silicon wafer. As a result, the SOI transistor requires a cost higher than that of field effect transistors formed in a bulk semiconductor substrate.

In addition, there are problems in that the deviation in thickness of the SOI layer is great in the ion-implanting or the polishing and that when the SOI layer is thinned to manufacture a complete depletion-mode SOI transistor, it is difficult to stabilize the characteristics of the field effect transistors.

On the other hand, in the method disclosed in T. Sakai et al.'s paper, since only the SiGe layer is selectively removed by the use of a selectivity ratio between Si and SiGe, there is a problem in that the etching distance of the SiGe layer is restricted and the area of the SOI layer is restricted. Here, when the concentration of Ge increases in the SiGe layer, the selectivity ratio between Si and SiGe can increase. However, when the concentration of Ge in the SiGe layer increases, it is difficult to increase the thickness of the SiGe layer while maintaining the crystal quality. Accordingly, the thickness of the BOX layer decreases and the crystal quality of the Si layer formed on the SiGe layer deteriorates, thereby reducing the characteristics of the SOI transistor.

SUMMARY

An advantage of the present invention is to provide a method of manufacturing a semiconductor substrate and a method of manufacturing a semiconductor device, which make it possible to form a semiconductor layer on an insulator at low cost while alleviating a restriction on the area of the semiconductor layer which can be formed on the insulator.

According to an aspect of the present invention, there is provided a method of manufacturing a semiconductor device, the method comprising: forming a γ-aluminum oxide layer on a semiconductor substrate; forming a semiconductor layer on the γ-aluminum oxide layer; forming an exposed portion for exposing a part of the γ-aluminum oxide layer through the semiconductor layer; forming a support which is formed of a material having an etching rate smaller than that of the γ-aluminum oxide layer and which supports the semiconductor layer on the semiconductor substrate; forming a cavity, which the γ-aluminum oxide layer is removed from, between the semiconductor substrate and the semiconductor layer by selectively etching the γ-aluminum oxide layer through the exposed portion; and forming a buried insulating layer in the cavity by thermally oxidizing the semiconductor substrate and the semiconductor layer inside the cavity through the exposed portion.

Accordingly, it is possible to increase the etching rate ratio between the semiconductor layer and the γ-aluminum oxide layer while making it possible to form the semiconductor layer on the γ-aluminum oxide layer by the use of epitaxial growth. Therefore, since the γ-aluminum oxide layer can be selectively etched while preventing the semiconductor layer from being etched, it is possible to prevent the restriction to the etching area of the γ-aluminum oxide layer under the semiconductor layer. As a result, it is possible to increase the area of the semiconductor layer which can be formed on the insulating layer while suppressing the deterioration in crystal quality of the semiconductor layer. That is, it is possible to form the semiconductor layer with excellent crystal quality on the insulating layer at low cost.

In addition, since the γ-aluminum oxide layer can be removed with the semiconductor left by forming the semiconductor layer on the γ-aluminum oxide layer, it is possible to form the cavity under the semiconductor layer. Furthermore, by providing the support for supporting the semiconductor layer on the semiconductor substrate, it is possible to prevent the semiconductor layer from collapsing. As a result, since the semiconductor layer can be formed on the insulating layer while reducing the generation of defects in the semiconductor layer, it is possible to electrically isolate the semiconductor layer from the semiconductor substrate without damaging the quality of the semiconductor layer.

According to another aspect of the invention, there is provided a method of manufacturing a semiconductor device, the method comprising: forming a γ-aluminum oxide layer on a semiconductor substrate; forming a semiconductor layer on the γ-aluminum oxide layer; forming a first groove for exposing the semiconductor substrate through the γ-aluminum oxide layer and the semiconductor layer; forming in the first groove a support which is formed on the sidewalls of the γ-aluminum oxide layer and the semiconductor layer and has an etching rate smaller than that of the γ-aluminum oxide layer; forming a second groove for exposing at least a part of the γ-aluminum oxide layer, in which the support is formed on the sidewalls thereof, through the semiconductor layer; forming a cavity, which the γ-aluminum oxide layer is removed from, between the semiconductor substrate and the γ-aluminum oxide layer by selectively etching the γ-aluminum oxide layer through the second groove; and forming a buried insulating layer in the cavity by thermally oxidizing the semiconductor substrate and the semiconductor layer inside the cavity through the first groove and the second groove.

Accordingly, it is possible to increase the etching rate ratio between the semiconductor layer and the γ-aluminum oxide layer while making it possible to form the semiconductor layer on the γ-aluminum oxide layer by the use of epitaxial growth. As a result, it is possible to increase the area of the semiconductor layer which can be formed on the insulating layer while suppressing the deterioration in crystal quality of the semiconductor layer.

In addition, it is possible to support the semiconductor layer on the semiconductor substrate by the use of the support formed in the first groove and to bring an etching gas or an etchant into contact with the γ-aluminum oxide layer under the semiconductor layer through the second groove. As a result, since the γ-aluminum oxide layer between the semiconductor layer and the semiconductor substrate can be removed while stably supporting the semiconductor layer on the semiconductor substrate, it is possible to electrically isolate the semiconductor layer from the semiconductor substrate without damaging the quality of the semiconductor layer. In addition, it is possible to form the insulating layer on the rear surface of the semiconductor layer by thermally oxidizing the semiconductor layer and to accurately control the thickness of the semiconductor layer.

In the method of manufacturing a semiconductor device described above, the semiconductor substrate and the semiconductor layer may be formed of monocrystalline Si.

Accordingly, it is possible to accomplish the lattice matching between the γ-aluminum oxide layer and the semiconductor layer and to increase the etching rate ratio between the semiconductor layer and the γ-aluminum oxide layer. As a result, since the semiconductor layer with excellent crystal quality can be formed on the γ-aluminum oxide layer, it is possible to electrically isolate the semiconductor layer from the semiconductor substrate without damaging the quality of the semiconductor layer.

In the method of manufacturing a semiconductor device described above, the γ-aluminum oxide layer may be selectively etched through the use of a hydrofluoric acid treatment or a phosphoric acid treatment of the γ-aluminum oxide layer.

Accordingly, since the γ-aluminum oxide layer can be removed while preventing the semiconductor layer from coming in contact with an etchant, it is possible to electrically isolate the semiconductor layer from the semiconductor substrate without damaging the quality of the semiconductor layer even when the etching rate of the γ-aluminum oxide layer under the semiconductor layer increases.

The method of manufacturing a semiconductor device described above may further comprise ion-implanting $N_2$ into the interface between the γ-aluminum oxide layer and the semiconductor layer, after forming the semiconductor layer on the γ-aluminum oxide layer.

Accordingly, since the aluminum component contained in the γ-aluminum oxide layer can be prevented from diffusing into the semiconductor layer by adding the ion-implanting process, it is possible to prevent the quality of the semiconductor layer from deteriorating while suppressing the complication of the manufacturing process.

According to still another aspect of the invention, there is provided a method of manufacturing a semiconductor device, the method comprising: forming a γ-aluminum oxide layer on a semiconductor substrate; forming a semiconductor layer on the γ-aluminum oxide layer; forming an exposed portion for exposing a part of the γ-aluminum oxide layer through the semiconductor,layer; forming a support which is formed of a material having an etching rate smaller than that of the γ-aluminum oxide layer and which supports the semiconductor layer on the semiconductor substrate; forming a cavity, which the γ-aluminum oxide layer is removed from, between the semiconductor substrate and the semiconductor layer by selectively etching the γ-aluminum oxide layer through the exposed portion; forming a buried insulating layer in the cavity by thermally oxidizing the semiconductor substrate and the semiconductor layer inside the cavity through the exposed portion; forming a gate electrode on the semiconductor layer with a gate insulating layer therebetween; and forming source/drain layers, which are disposed on both sides of the gate electrode, in the semiconductor layer.

Accordingly, it is possible to remove the γ-aluminum oxide layer between the semiconductor layer and the semiconductor substrate in the wide range while stably supporting the semiconductor layer on the semiconductor substrate. In addition, it is possible to form the insulating layer on the rear surface of the semiconductor layer by the use of the thermal oxidation of the semiconductor layer. As a result, since the semiconductor layer can be formed on the insulating layer and the area of the semiconductor layer which can be formed on the insulating layer can increase by the use of a bulk substrate, it is possible to suppress the cost-up and to form an SOI transistor with high quality.

According to still another aspect of the present invention, there is provided a method of manufacturing a semiconductor device, the method comprising: forming a γ-aluminum oxide layer on a semiconductor substrate; forming a semiconductor layer on the γ-aluminum oxide layer; forming a first groove for exposing the semiconductor substrate through the γ-aluminum oxide layer and the semiconductor layer; forming in the first groove a support which is disposed on the sidewalls of the γ-aluminum oxide layer and the semiconductor layer and has an etching rate smaller than that of the γ-aluminum oxide layer; forming a second groove for exposing at least a part of the γ-aluminum oxide layer, in which the support is formed on the sidewalls thereof, through the semiconductor layer; forming a cavity, which the γ-aluminum oxide layer is removed from, between the semiconductor substrate and the γ-aluminum oxide layer by selectively etching the γ-aluminum oxide layer through the second groove; forming a buried insulating layer in the cavity by thermally oxidizing the semiconductor substrate and the semiconductor layer inside the cavity through the first groove and the second groove; forming a gate electrode on the semiconductor layer with a gate insulating layer therebetween; and forming source and drain layers, which are disposed on both sides of the gate electrode, in the semiconductor layer.

Accordingly, it is possible to remove the γ-aluminum oxide layer between the semiconductor layer and the semiconductor substrate in the wide range while stably supporting the semiconductor layer on the semiconductor substrate. In addition, it is possible to form the insulating layer on the rear surface of the semiconductor layer by the use of the thermal oxidation of the semiconductor layer. As a result, since the semiconductor layer can be formed on the insulating layer and the area of the semiconductor layer which can be formed on the insulating layer can increase by the use of a bulk substrate, it is possible to suppress the cost-up and to form an SOI transistor with high quality.

In the method of manufacturing a semiconductor device described above, the first groove and the second groove may be disposed in an element isolating region.

Accordingly, it is possible to carry out the vertical and horizontal element isolation of the semiconductor layer at the same time and it is not necessary to provide a groove for removing the γ-aluminum oxide layer under the semiconductor layer to the element isolating region. As a result, since it is possible to form an SOI transistor while suppressing increase in the number of process steps and it is possible to suppress increase in chip size, it is possible to reduce the cost for the SOI transistor.

BRIEF DESCRIPTION OF THE DRAWINGS

The invention will be described with reference to the accompanying drawings, wherein like numbers reference like elements.

DESCRIPTION OF THE EMBODIMENTS

A method of manufacturing a semiconductor device according to exemplary embodiments of the present invention will be described with reference to the drawings.

FIGS. 1A to 8A are perspective views illustrating a method of manufacturing a semiconductor device according to an embodiment of the invention, FIGS. 1B to 8B are cross-sectional views taken along Lines A1-A1' to A8-A8' of FIGS. 1A to 8A, respectively, and FIGS. 1C to 8C are cross-sectional views taken along Lines B1-B1' to B8-B8' of FIGS. 1A to 8A, respectively.

Referring to FIG. 1, a γ-aluminum oxide layer ( γ-$Al_2O_3$ layer) 2 is formed on a semiconductor substrate 1 by the use of epitaxial growth and a semiconductor layer 3 is formed on the γ-aluminum oxide layer 2 by the use of epitaxial growth. The semiconductor substrate 1 and the semiconductor layer 3 may be formed of, for example, Si, Ge, SiGe, SiC, SiSn, PbS, GaAs, InP, GaP, GaN, ZnSe, or the like. Specifically, when the semiconductor substrate 1 is formed of Si, it is preferable that the semiconductor layer 3 is formed of Si. Accordingly, it is possible to secure a selectivity ratio between the γ-aluminum oxide layer 2 and the semiconductor layer 3 while accomplishing the lattice matching between the γ-aluminum oxide layer 2 and the semiconductor layer 3. The γ-aluminum oxide layer 2 may have a porous monocrystalline structure, in addition to a monocrystalline structure. Here, the γ-aluminum oxide layer may be made porous, for example, by using anodic oxidation.

In addition, after the semiconductor layer 3 is formed on the γ-aluminum oxide layer 2, $N_2$ may be ion-implanted into the interface between the γ-aluminum oxide layer 2 and the semiconductor layer 3. As a result, since aluminum components included in the γ-aluminum oxide layer 2 can be prevented from diffusing into the semiconductor layer 3, it is possible to prevent the deterioration in quality of the semiconductor layer 3 while suppressing the complication of manufacturing processes.

Figure 1A:
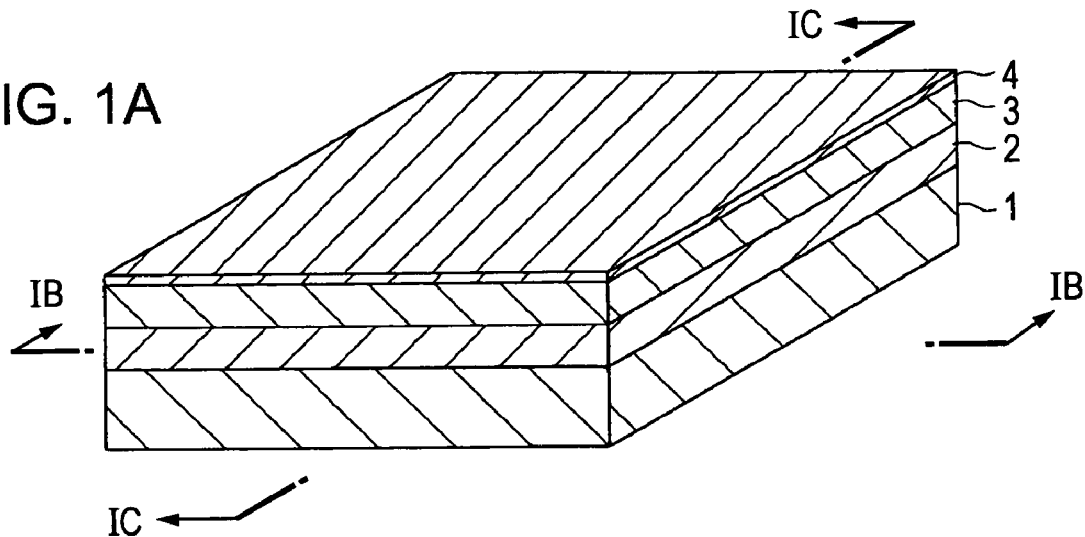
FIG. 1 is a diagram illustrating a method of manufacturing a semiconductor device according to an embodiment of the present invention.
Figure 1B:
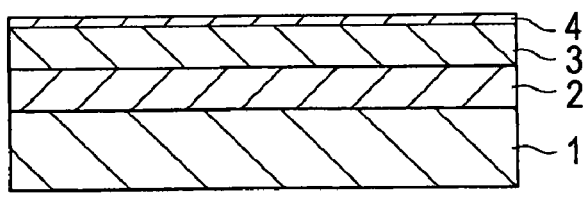
Figure 1C:
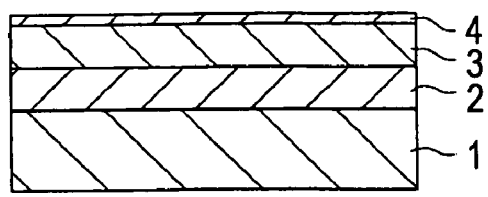
Figure 2A:
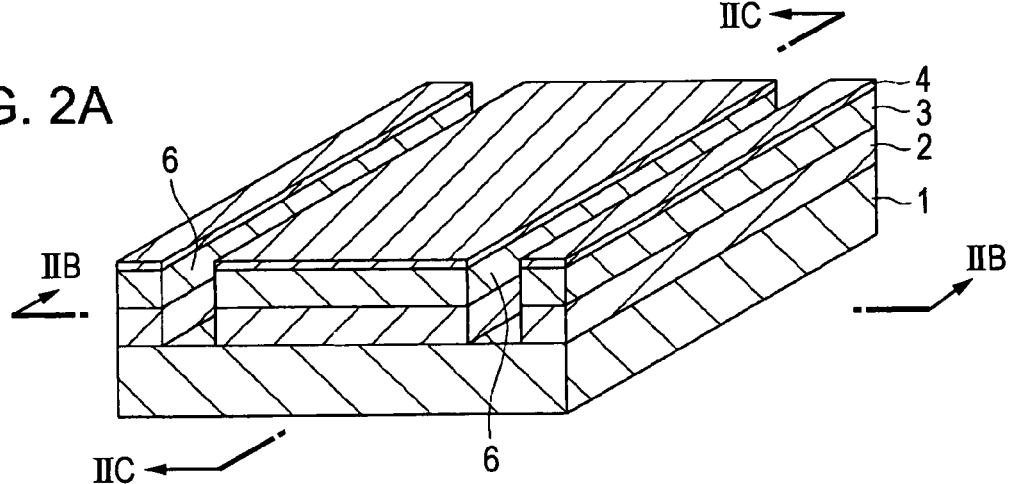
FIG. 2 is a diagram illustrating a method of manufacturing a semiconductor device according to an embodiment of the present invention.
Figure 2B:
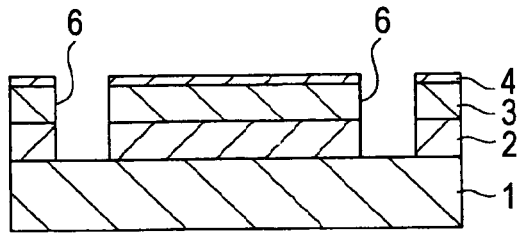
Figure 2C:
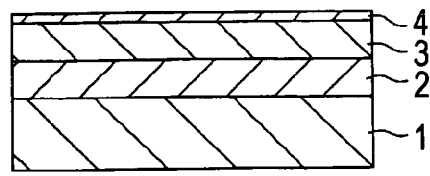

Then, a base oxide layer 4 is formed on the surface of the semiconductor layer 3 by the use of the thermal oxidation of the semiconductor layer 3 or the chemical vapor deposition (CVD) method. Next, as shown in FIG. 2, by patterning the base oxide layer 4, the semiconductor layer 3, and the γ-aluminum oxide layer 2 by the use of a photolithography process or an etching process, a groove 6 for exposing a part of the semiconductor substrate 1 is formed. Here, when a part of the semiconductor substrate 1 is exposed, the etching may be stopped on the surface of the semiconductor substrate 1 or the semiconductor substrate 1 may be over-etched so as to form a concave portion in the semiconductor substrate 1. The position of the groove 6 may be made to correspond to a part of an element isolating region of the semiconductor layer 3.

Figure 3A:
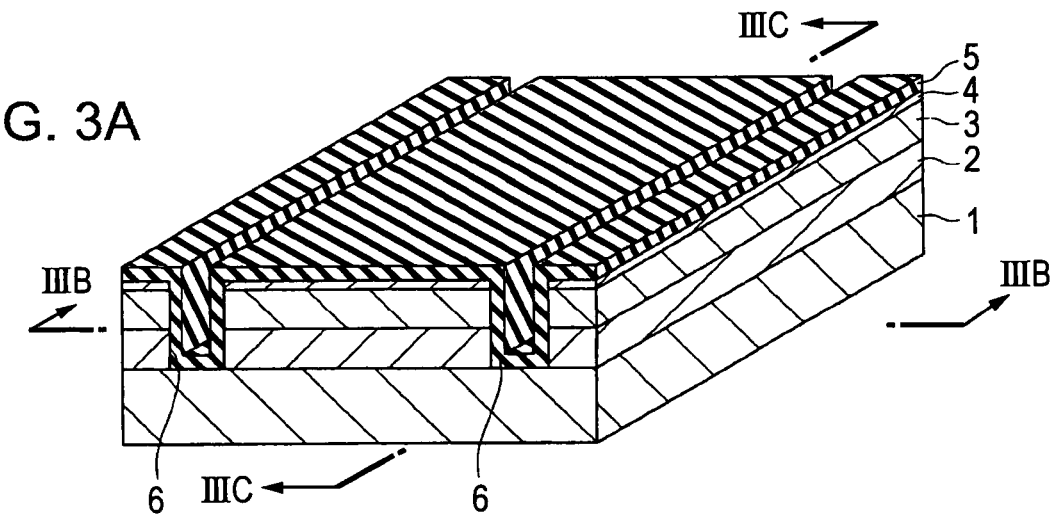
FIG. 3 is a diagram illustrating a method of manufacturing a semiconductor device according to an embodiment of the present invention.
Figure 3B:
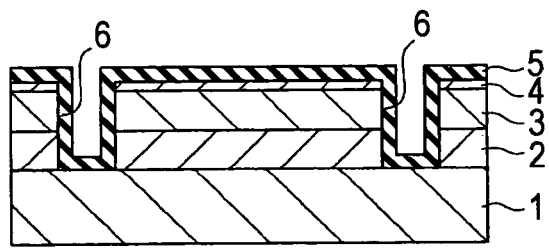
Figure 3C:
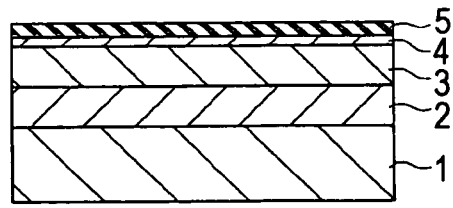

Next, a support 5 is formed on the whole resultant surface by the use of the CVD method or the like. As shown in FIG. 3, the support 5 is also formed on the sidewalls of the γ-aluminum oxide layer 2 and the semiconductor layer 3 inside the groove 6, thereby supporting the semiconductor layer 3 on the semiconductor substrate 1. The support 5 is formed of an insulator such as a silicon oxide film or a silicon nitride film.

Figure 4A:
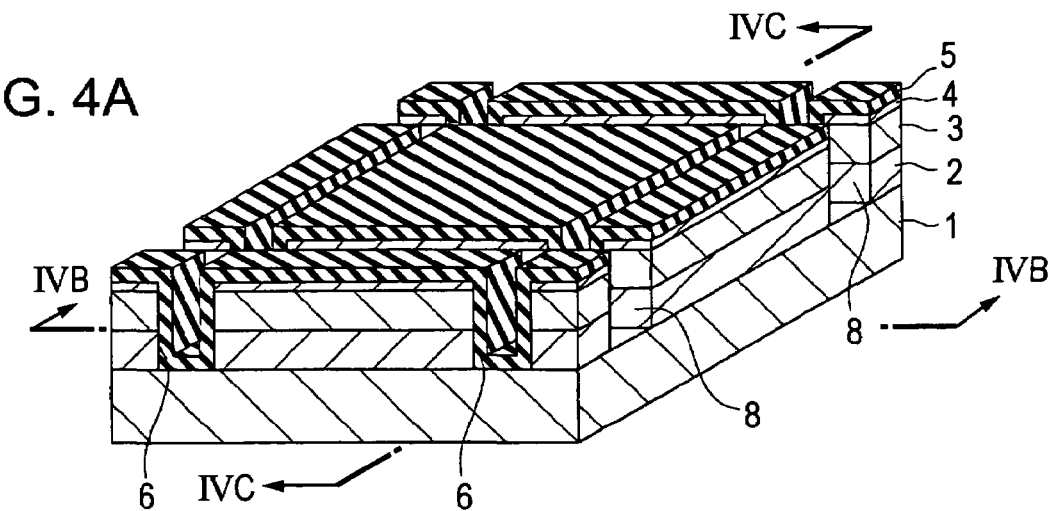
FIG. 4 is a diagram illustrating a method of manufacturing a semiconductor device according to an embodiment of the present invention.
Figure 4B:
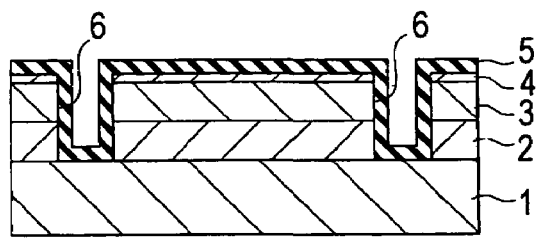
Figure 4C:
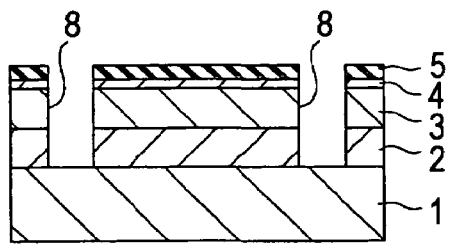

Next, as shown in FIG. 4, by patterning the support 5, the base oxide layer 4, the semiconductor layer 3, and the γ-aluminum oxide layer 2 by the use of a photolithography process or an etching process, a groove 8 for exposing a part of the γ-aluminum oxide layer 2 is formed. Here, the position of the groove 8 may be made to correspond to the other portion of the element isolating region of the semiconductor layer 3.

In addition, when a part of the γ-aluminum oxide layer 2 is exposed, the etching may be stopped on the surface of the γ-aluminum oxide layer 2 or the γ-aluminum oxide layer 2 may be over-etched so as to form a concave portion in the γ-aluminum oxide layer. Alternatively, the surface of the semiconductor substrate 1 may be exposed through the γ-aluminum oxide layer 2 inside the groove 8. Here, by stopping the etching of the γ-aluminum oxide layer 2 in the way, it is possible to prevent the surface of the semiconductor substrate 1 inside the groove from being exposed. As a result, when the γ-aluminum oxide layer 2 is removed by the use of the etching, it is possible to reduce the time for allowing the semiconductor substrate 1 inside the groove 8 to be exposed to an etchant or an etching gas, thereby suppressing the over-etching of the semiconductor substrate 1 inside the groove 8.

Figure 5A:
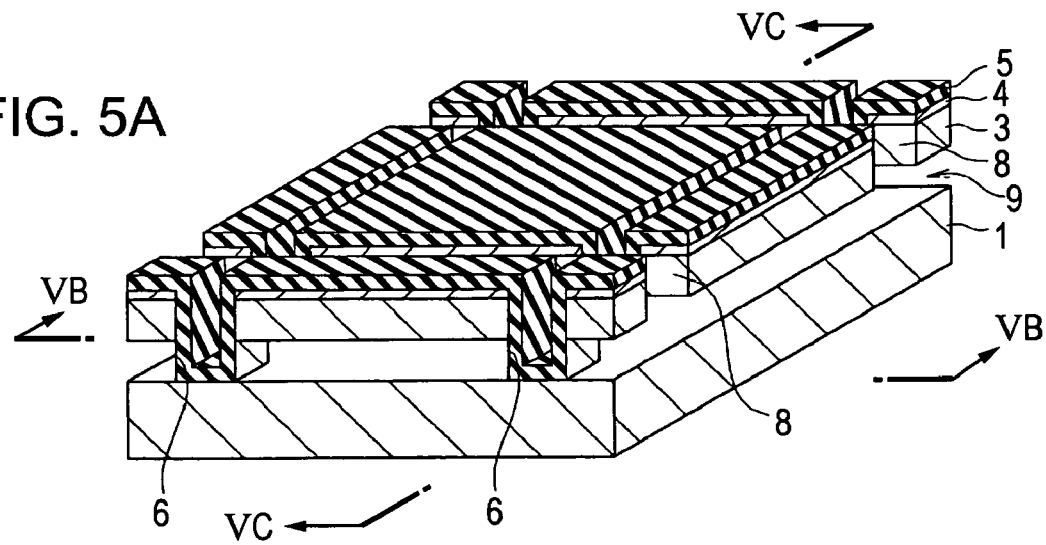
FIG. 5 is a diagram illustrating a method of manufacturing a semiconductor device according to an embodiment of the present invention.
Figure 5B:
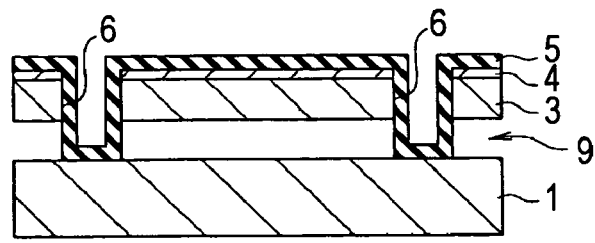
Figure 5C:
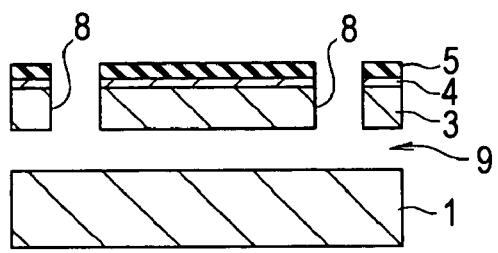

Next, as shown in FIG. 5, by bringing the etching gas or the etchant into contact with the γ-aluminum oxide layer 2 through the groove 8, the γ-aluminum oxide layer 2 is removed by the use of the etching so as to form a cavity 9 between the semiconductor substrate 1 and the semiconductor layer 3.

Here, by using the γ-aluminum oxide layer 2 as a sacrificial layer disposed under the semiconductor layer 3, it is possible to form the semiconductor layer 3 on the γ-aluminum oxide layer by the use of epitaxial growth and in addition to increase an etching rate ratio between the semiconductor layer 3 and the γ-aluminum oxide layer 2. As a result, since the γ-aluminum oxide layer 2 can be selectively etched while preventing the etching of the semiconductor layer 3, it is possible to prevent the restriction to the etching area of the γ-aluminum oxide layer 2. Accordingly, since the deterioration in crystal quality of the semiconductor layer 3 can be suppressed and the area of the semiconductor layer 3 which can be formed on an oxide layer 10 can be increased, it is possible to form the semiconductor layer 3 with excellent crystal quality on the oxide layer 10 at low cost.

By providing the support 5 in the groove 6, it is possible to support the semiconductor layer 3 on the semiconductor substrate 1 even when the γ-aluminum oxide layer 2 is removed. By providing the groove 8 in addition to the groove 6, it is possible to bring the etching gas or the etchant into contact with the γ-aluminum oxide layer 2 under the semiconductor layer 3. Accordingly, it is possible to accomplish the electrical isolation between the semiconductor layer 3 and the semiconductor substrate 1 without damaging the quality of the semiconductor layer 3.

When the semiconductor substrate 1 and the semiconductor layer 3 are all formed of Si, it is preferable that hydrofluoric acid or phosphoric acid is used as the etchant for the γ-aluminum oxide layer 2. Here, since Si is not etched with the hydrofluoric acid or the phosphoric acid, the etching rate ratio between the γ-aluminum oxide layer 2 and the semiconductor layer 3 can be set as almost infinite. Therefore, it is possible to prevent the semiconductor substrate 1, the semiconductor layer 3, and the support 5 from being etched with the etchant and to selectively remove the γ-aluminum oxide layer 2.

Figure 6A:
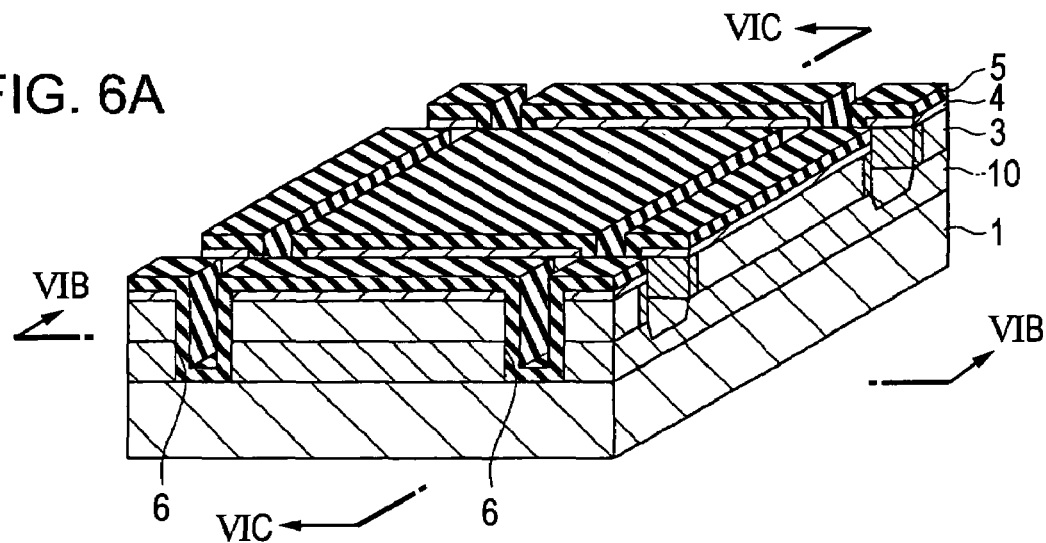
FIG. 6 is a diagram illustrating a method of manufacturing a semiconductor device according to an embodiment of the present invention.
Figure 6B:
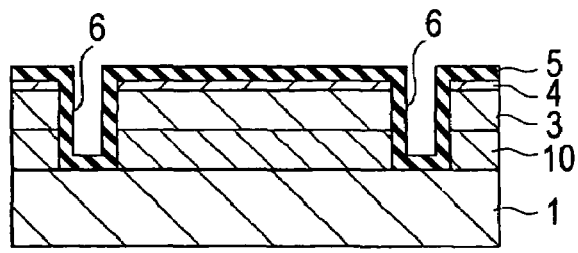
Figure 6C:
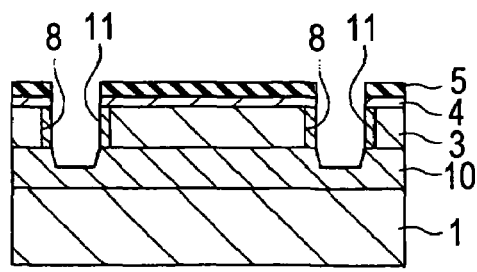

Next, as shown in FIG. 6, by thermally oxidizing the semiconductor substrate 1, the semiconductor layer 3, and the support 5, an oxide layer 10 is formed in the cavity 9 between the semiconductor substrate 1 and the semiconductor layer 3 and an oxide layer 11 is formed on the sidewall of the semiconductor layer 3 inside the groove 8. At the same time, the support 5 is converted into an oxide layer 12.

Accordingly, it is possible to define the thickness of the semiconductor layer 3 after elements are isolated from each other, by the use of the thickness of the semiconductor layer 3 at the time of the epitaxial growth and the thickness of the oxide layer 11 at the time of the thermal oxidation of the semiconductor layer 3. As a result, by controlling the thickness of the semiconductor layer 3 with high precision, it is possible to reduce the deviation in thickness of the semiconductor layer 3 and to reduce the thickness of the semiconductor layer 3.

By sequentially forming on the semiconductor substrate 1 the γ-aluminum oxide layer 2 and the semiconductor layer 3 having different etching rates and forming the grooves 6 and 8 by two steps, it is possible to form the oxide layer 10 in the cavity 9 between the semiconductor substrate 1 and the semiconductor layer 3. As a result, since an SOI substrate with excellent quality can be stably manufactured with the number of process steps suppressed, it is possible to stably manufacture the SOI transistor with the increase in cost suppressed.

In addition, by providing the support 5 on the semiconductor layer 3, it is possible to form the oxide layer 10 on the rear surface of the semiconductor layer while preventing the surface of the semiconductor layer 3 from being thermally oxidized. As a result, since the surface of the semiconductor layer 3 can be exposed while preventing the oxide layer 11 formed inside the groove from being etched, it is possible to stably perform the element isolation and to form a transistor on the semiconductor layer 3.

By allowing the positions of the grooves 6 and 8 to correspond to the element isolation region, it is possible to perform the vertical and horizontal element isolations of the semiconductor layer 3 at the same time and it is not necessary to additionally provide a groove for removing the γ-aluminum oxide layer 2 under the semiconductor layer 3. As a result, while suppressing the increase in the number of process steps, it is possible to form the SOI transistor and to suppress the increase in chip size, thereby accomplishing the decrease in cost for the SOI transistor.

A high-temperature annealing may be performed after forming the oxide layers 10 and 11. As a result, since the oxide layers 10 and 11 can be reflowed, it is possible to reduce the stress on the oxide layers 10 and 11 and to reduce the interface level. In addition, by performing the high-temperature annealing after forming the oxide layers 10 and 11, it is possible to remove a gap in the oxide layer 10 even when the gap remains in the oxide layer 10 buried in the cavity.

Although the method of forming the oxide layer 10 in the cavity 9 between the semiconductor substrate 1 and the semiconductor layer 3 by thermally oxidizing the semiconductor substrate 1 and the semiconductor layer 3 has been described in the method shown in FIG. 6, an insulating layer may be filled in the cavity 9 between the semiconductor substrate 1 and the semiconductor layer 3 by the use of the CVD method or the like.

Figure 7A:
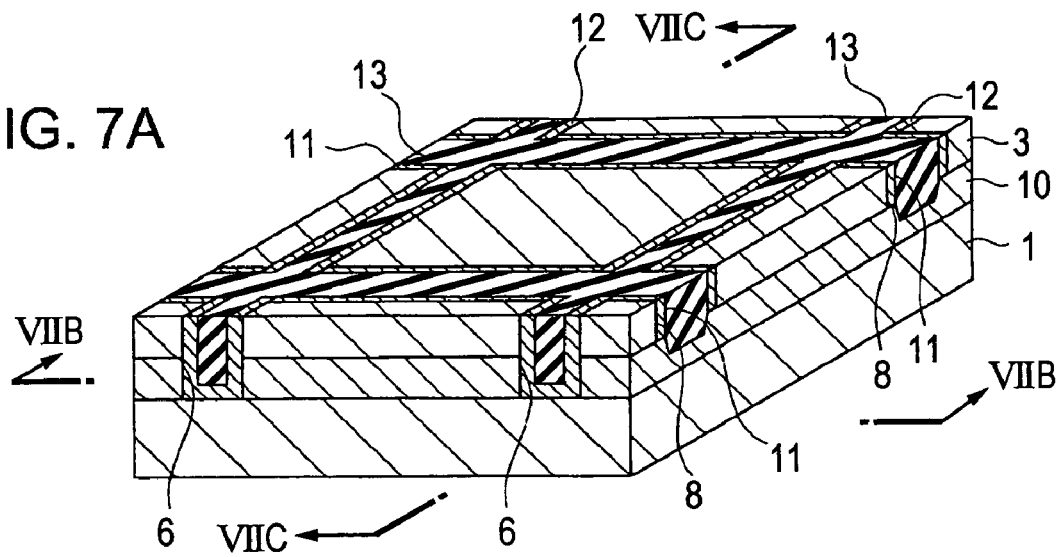
FIG. 7 is a diagram illustrating a method of manufacturing a semiconductor device according to an embodiment of the present invention.
Figure 7B:
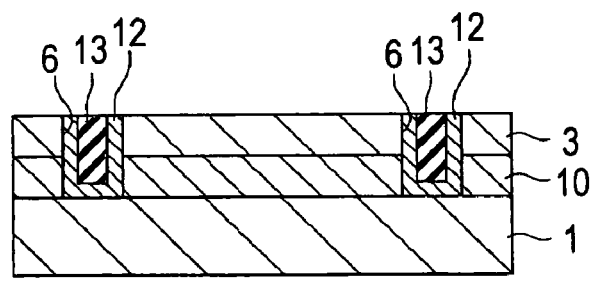
Figure 7C:
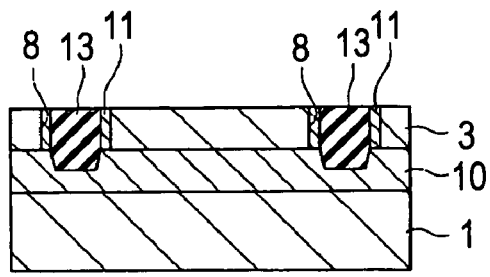
Figure 8A:
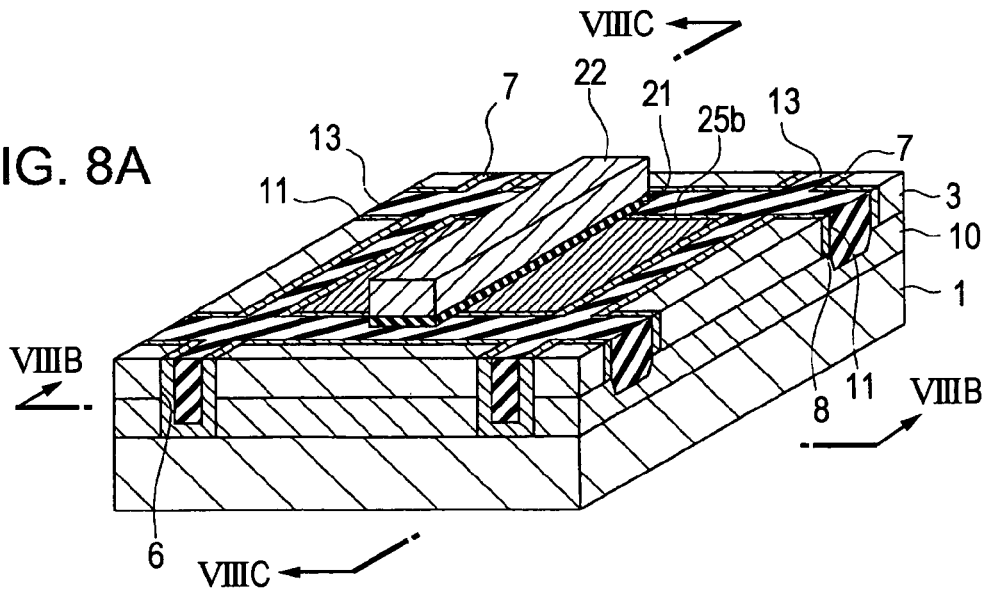
FIG. 8 is a diagram illustrating a method of manufacturing a semiconductor device according to an embodiment of the present invention.
Figure 8B:
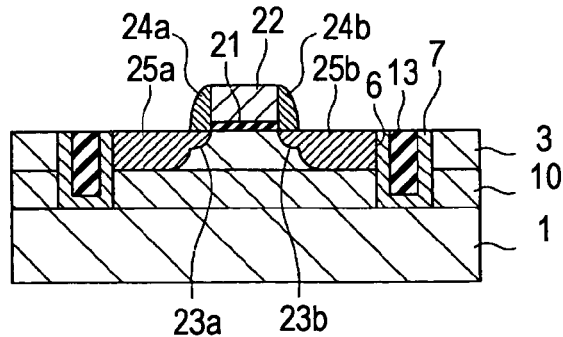
Figure 8C:
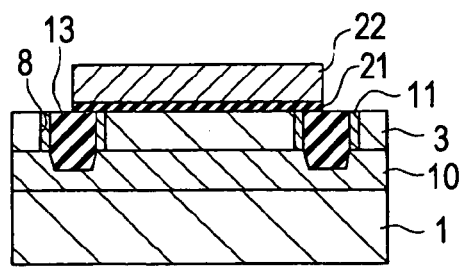

Next, as shown in FIG. 7, a buried insulating layer 13 is filled in the grooves 6 and 8 by the use of the CVD method or the like and then the base oxide layer 4 and the support 5 on the base oxide layer 4 are removed. As a result, since the buried insulating layer 13 can be filled in the grooves 6 and 8 at the same time, it is possible to stably perform the element isolation while suppressing the increase in the number of process steps. In addition, the buried insulating layer 13 may be filled in the grooves 6 and 8 after removing the base oxide layer 4 and the support 5 on the base oxide layer 4. If necessary, the buried insulating layer 13 may be made flat by the use of a chemical mechanical polishing (CMP) method or the like.

Next, as shown in FIG. 8, by thermally oxidizing the surface of the semiconductor layer 3, a gate insulating layer 21 is formed on the surface of the semiconductor layer 3. Then, a polycrystalline silicon layer is formed on the semiconductor layer 3 with the gate insulating layer 21 therebetween, by the use of the CVD method or the like. Then, by patterning the polycrystalline silicon layer by the use of a photolithography process and an etching process, a gate electrode 22 is formed on the semiconductor layer 3.

Next, by ion-implanting impurities such as As, P, B, or the like into the semiconductor layer 3 using the gate electrode 22 as a mask, LDD layers 23a and 23b, which are disposed on both sides of the gate electrode 22 and are lightly-doped layers, are formed in the semiconductor layer 3. Thereafter, by forming an insulating layer on the semiconductor layer 3 in which the LDD layers 23a and 23b are formed and then etching-back the insulating layer by the use of an anisotropic etching such as RIE or the like, sidewall spacers 24a and 24b are formed on the sidewalls of the gate electrode 22. Then, by ion-implanting impurities such as As, P, B, or the like into the semiconductor layer 3 using the gate electrode 22 and the sidewall spacers 24a and 24b as a mask, source and drain layers 25a and 25b, which are disposed on both sides of the sidewall spacers 24a and 24b and are highly-doped layers, are formed in the semiconductor layer 3.

Accordingly, it is possible to stably support the semiconductor layer 3 on the semiconductor substrate 1 and to remove the γ-aluminum oxide layer 2 between the semiconductor layer 3 and the semiconductor substrate 1 over a wide range of area. In addition, it is possible to form the oxide layer 10 on the rear surface of the semiconductor layer 3 by thermally oxidizing the semiconductor layer 3. As a result, it is possible to form the semiconductor layer 3 on the oxide layer 10 by using a bulk substrate and to increase the area of the semiconductor layer 3 which can be formed on the oxide layer 10. Therefore, it is possible to form the SOI transistor with high quality while suppressing the increase in cost.

Although the method of filling the grooves 6 and 8 with the buried insulating layer 13 at the same time after forming the oxide layers 10 and 11 has been described in the embodiments described above, the insulator may be filled in the groove 6 in which the support 5 has been formed before forming the groove 8. Accordingly, since the support 5 can be reinforced with the insulator, it is possible to stably support the semiconductor layer 3 on the semiconductor substrate 1 even when the area of the groove 6 is small.

Although the method of forming only one semiconductor layer 3 on the semiconductor substrate 1 with the oxide layer 10 therebetween has been described in the embodiments described above, a plurality of semiconductor layers may be formed on the semiconductor substrate 1 with oxide layers therebetween, respectively.

The entire disclosure of Japanese Patent Application No. 2004-348236, filed Dec. 1, 2004 is expressly incorporated by reference herein.

What is claimed is:

1. A method of manufacturing a semiconductor device, the method comprising: forming a γ-aluminum oxide layer on a semiconductor substrate; subsequently forming a semiconductor layer on the γ-aluminum oxide layer; forming an exposed portion for exposing a part of the γ-aluminum oxide layer through the semiconductor layer; forming a support which is formed of a material having an etching rate smaller than that of the γ-aluminum oxide layer and which supports the semiconductor layer on the semiconductor substrate; forming a cavity, which the γ-aluminum oxide layer is removed from, between the semiconductor substrate and the semiconductor layer by selectively etching the γ-aluminum oxide layer through the exposed portion; forming a buried insulating layer in the cavity by thermally oxidizing the semiconductor substrate and the semiconductor layer inside the cavity through the exposed portion; forming a gate electrode on the semiconductor layer with a gate insulating layer therebetween; and forming source/drain layers, which are disposed on both sides of the gate electrode, in the semiconductor layer.

2. A method of manufacturing a semiconductor device, the method comprising: forming a γ-aluminum oxide layer on a semiconductor substrate; subsequently forming a semiconductor layer on the γ-aluminum oxide layer; forming a first groove for exposing the semiconductor substrate through the γ-aluminum oxide layer and the semiconductor layer; forming in the first groove a support which is disposed on the sidewalls of the γ-aluminum oxide layer and the semiconductor layer and has an etching rate smaller than that of the γ-aluminum oxide layer; forming a second groove for exposing at least a part of the γ-aluminum oxide layer, in which the support is formed on the sidewalls thereof, through the semiconductor layer; forming a cavity, which the γ-aluminum oxide layer is removed from, between the semiconductor substrate and the γ-aluminum oxide layer by selectively etching the γ-aluminum oxide layer through the second groove; forming a buried insulating layer in the cavity by thermally oxidizing the semiconductor substrate and the semiconductor layer inside the cavity through the first groove and the second groove; forming a gate electrode on the semiconductor layer with a gate insulating layer therebetween; and forming source and drain layers, which are disposed on both sides of the gate electrode, in the semiconductor layer.

3. The method according to claim 1, wherein the semiconductor substrate and the semiconductor layer are formed of monocrystalline silicon.

4. The method according to claim 1, wherein the γ-aluminum oxide layer is selectively etched through the use of a hydrofluoric acid treatment or a phosphoric acid treatment of the γ-aluminum oxide layer.

5. The method according to claim 1, further comprising ion-implanting $N_2$ into the interface between the γ-aluminum oxide layer and the semiconductor layer, after forming the semiconductor layer on the γ-aluminum oxide layer.

6. The method according to claim 1, wherein the first groove and the second groove are disposed in an element isolating region.

* * * * *